(12) United States Patent
Weinfurtner et al.

(10) Patent No.: US 6,355,773 B1
(45) Date of Patent: Mar. 12, 2002

(54) FUNCTIONAL POLYMER AND ORGANIC ELECTROLUMINESCENCE ELEMENT, OPTICAL MEMORY, AND HOLE TRANSPORT ELEMENT USING THE SAME

(75) Inventors: Karl-Heinz Weinfurtner, Berlin (DE); Hisayoshi Fujikawa, Aichi (JP); Shizuo Tokito, Aichi (JP); Yasunori Taga, Aichi (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 0 days.

(21) Appl. No.: 09/717,042

(22) Filed: Nov. 22, 2000

(30) Foreign Application Priority Data

Nov. 24, 1999 (JP) .............................. 11-333473

(51) Int. Cl.$^7$ .............................................. C08G 63/00
(52) U.S. Cl. ........................................................ 528/366
(58) Field of Search ......................................... 528/366

(56) References Cited

U.S. PATENT DOCUMENTS

| | | | |
|---|---|---|---|
| 5,777,070 A | 7/1998 | Inbasekaran et al. | 528/394 |
| 5,807,974 A | 9/1998 | Kim et al. | 528/366 |
| 5,998,045 A | 12/1999 | Chen et al. | 428/690 |

Primary Examiner—Terressa M. Boykin

(74) *Attorney, Agent, or Firm*—Oblon, Spivak, McClelland, Maier & Neustadt, P.C.

(57) ABSTRACT

The invention features a functional polymer which provides three primary colors and is free from aggregation of high molecular chains. The functional polymer is obtained by copolymerization of fluorene unit and acene unit having three or more benzene rings or hetero rings, and has the structure denoted by the following formula:

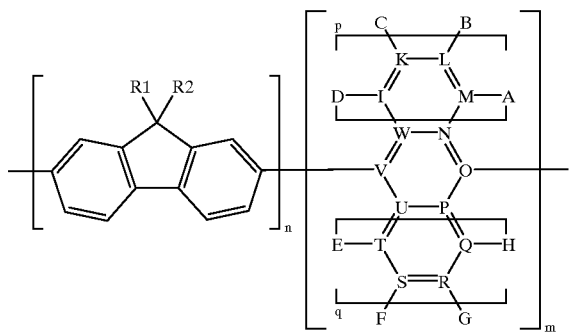

wherein A through H are selected from alkyl, thioalkyl, alkoxy, aryl, aryloxy, or the like; I and K through W are selected from C, O, N, P, S, and Si, R1 and R2 are selected from alkyl (iso or normal), cycloalkyl, acyl, or the like; p and q are integer numbers which satisfy $p+q \geqq 2$; and n and m are integers equal to or greater than 1.

13 Claims, 5 Drawing Sheets

FUNCTIONAL POLYMER AND ORGANIC ELECTROLUMINESCENCE ELEMENT, OPTICAL MEMORY, AND HOLE TRANSPORT ELEMENT USING THE SAME

BACKGROUND OF THE INVENTION

1. Field of the Invention

The present invention relates to an improved functional polymer which can be used for an organic electroluminescence element or the like.

2. Description of Related Art

Electroluminescence elements employing an organic component have been studied as potential next generation flat display devices. In particular, when a low molecular compound is used to form a layered thin film by vacuum deposition, full-color display devices with high reliability can be produced. However, devices produced in such a manner are expensive and could not easily have a large area.

To cope with these disadvantages, organic electroluminescence elements (polymer type electroluminescence elements) have been proposed, which are composed of a thin film formed by application of a polymer including phenylenevinylene and fluorene as its basic skeleton, from a solution. Especially, polymers including fluorene as the basic skeleton have been found to achieve high emission efficiency. Although polyfluorene, obtained by polymerization of fluorene, emits blue light with an emission peak at a wavelength of approximately 430 nm in its fundamental unit, the emission properties are not stable and emission efficiency is relatively low. In view of this, a copolymer obtained by synthesizing fluorene with another structural unit has been proposed, as reported in Japanese Publication of Unexamined PCT Patent Application No. 11-510535 and Applied Physics Letters 74, 2265 (1999).

However, even when the copolymers disclosed in the above-referenced documents are employed, display of three primary colors (red, green, blue) as required full-color display can not be readily achieved.

Further, the molecular chains of fluorene are likely to align with each other because of the liquid crystal property of fluorene polymers. As a result, the molecular chains aggregate due to thermal motion such that excitation energy is transferred to the aggregation which then emits light. Typically, long wave light with a low energy level is emitted, which leads to an additional problem that blue emission cannot be obtained by conventional fluorene-based polymers.

SUMMARY OF THE INVENTION

The present invention was made in view of the foregoing problems of the related art, and aims to provide a functional polymer which is free from aggregation of high molecular chains and is capable of easily providing three primary colors.

To this end, according to the present invention, there is provided a functional polymer comprising a compound obtained by copolymerization of a fluorene unit and an acene unit having three or more benzene rings.

Further, in the above functional polymer, said acene unit is at least one of anthracene, naphthacene, or pentacene.

Further, the above functional polymer consists of copolymers of a fluorene unit and anthracene.

Still further, said acene unit has the right part of the following structure:

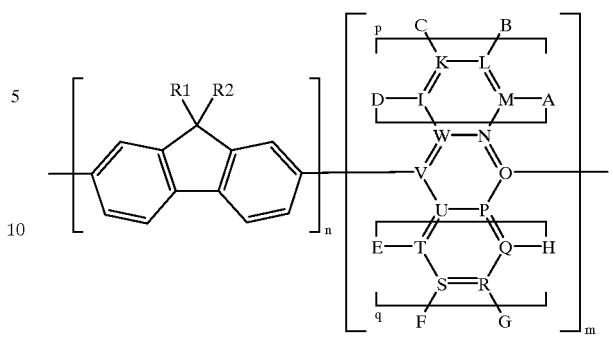

wherein A through H are selected from alkyl, thioalkyl, alkoxy, aryl, aryloxy, thioaryl, heteroaryl, alkenyl, alkinyl, cyano, nitro, NHAr, NAr$_2$, condensed heterocyclic compound and a substituent including fluorine; I and K through W are selected from C, O, N, P, S, and Si; R1 and R2 are selected from alkyl (iso or normal), cycloalkyl, acyl, heteroaryl and aryl, alkenyl, stylyl, alkinyl, cyano, nitro, NHAr, NAr$_2$, and CF$_3$; p and q are integer numbers which satisfy p+q≧2; and n and m are integers equal to or greater than 1.

Further, in the above functional polymer, a ratio of said acene unit in the polymer skeleton is 15% or less.

Further, the above functional polymer is obtained by copolymerizing a monomer of the following formula and a fluorene monomer:

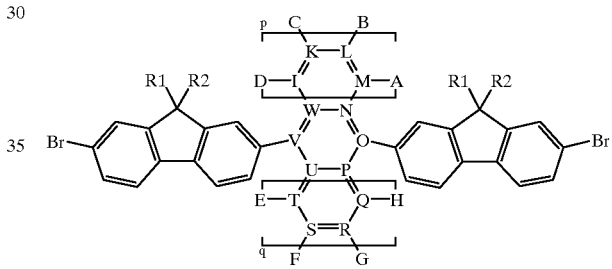

wherein A through H are selected from alkyl, thioalkyl, alkoxy, aryl, aryloxy, thioaryl, heteroaryl, alkenyl, alkinyl, cyano, nitro, NHAr, NAr$_2$, condensed heterocyclic compound and a substituent including fluorine; I and K through W are selected from C, O, N, P, S, and Si, R1 and R2 are selected from functional groups of alkyl (iso or normal), alkoxy, cycloalkyl, acyl, heteroaryl and aryl, alkenyl, stylyl, alkinyl, cyano, nitro, NHAr, NAr$_2$, and CF$_3$; and p and q are integer numbers which satisfy p+q≧2.

According to each of the above-mentioned structures, a functional polymer having an emission function which is highly effective and highly stable, a reversible optical property, and a high carrier transport ability can be obtained.

Also, there is provided an organic electroluminescence element wherein the above functional polymer is used.

According to the above organic electroluminescence element, a planar light source which is highly effective and of low cost with large area as well as a full-color flat display can be implemented.

Further, there is provided an optical memory wherein the above functional polymer is optically excited to store information.

According to the above structure, a high-density optical memory can be implemented.

There is also provided a hole transport element wherein the above functional polymer is used.

Thus, an electrophotographic photoreceptor of high performance can be further implemented.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

Figure 1:
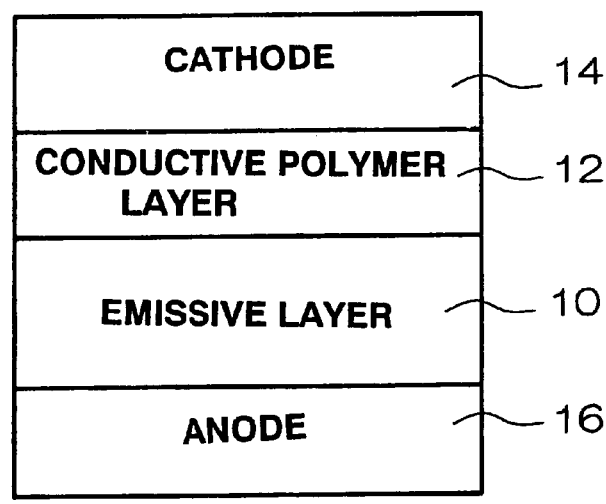
FIG. 1 is a cross-sectional view of an organic electroluminescence element according to one embodiment of the invention.

FIG. 1 is a cross-sectional view of an organic electroluminescence element according to one embodiment of the present invention. Referring to FIG. 1, a conductive polymer layer 12 functioning as a hole doping layer is formed on an emissive layer 10, and a cathode 14 is further provided on the conductive polymer layer 12. Under the emissive layer 10 is disposed an anode 16.

These layers are actually formed as follows. First, on the cathode 14 composed of ITO or the like, the conductive polymer layer 12 formed by a copper phthalocyanine (CuPc) or PEDT (polydioxyethyleneoxythiophene) derivative is disposed. Then, the emissive layer 10 composed of a functional polymer containing polyfluorene (PFO) is formed thereon using spin coating technique. In this case, xylene or THF is used as a solvent. The layered film is then dried for four hours or more at a room temperature before the anode 16 composed of Ca is formed thereon. The anode 16 may alternatively be composed of a metal, a metal compound, or an alloy having a small work function, such as Mg—Ag alloy or Al—Li alloy.

Figure 2:
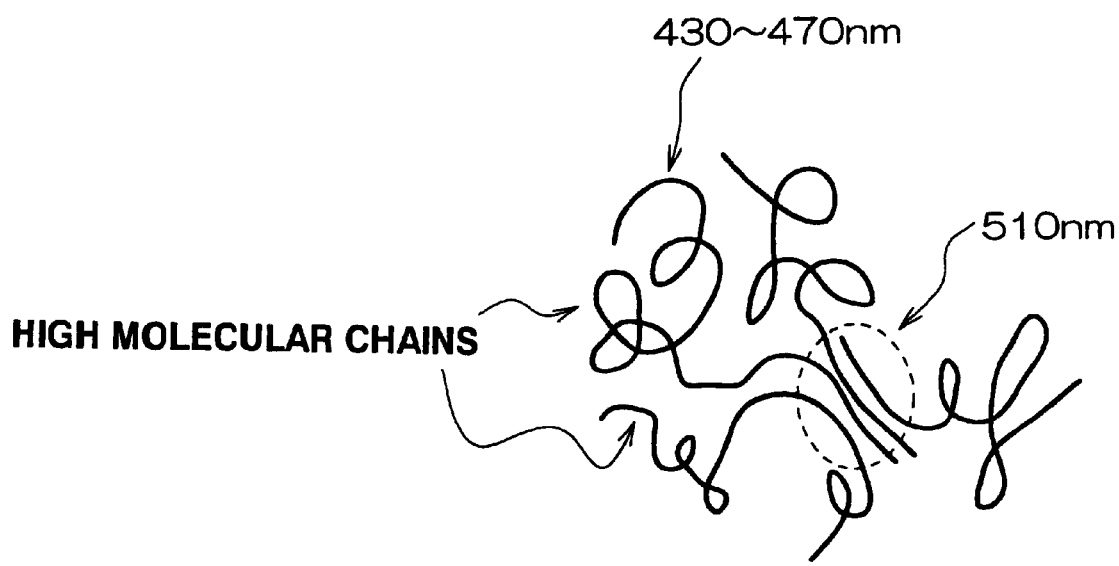
FIG. 2 is an explanatory view depicting aggregation of high molecular chains of polyfluorene.

When conventional polyfluorene (PFO) is employed in the emissive layer 10, there is a possibility that 510 nm light, which has a wavelength longer than the 430–470 nm emission wavelength for polyfluorne, may be emitted. This is because high molecular chains of polyfluorene are arranged in parallel to each other due to their liquid crystal property as shown in FIG. 2 by the region enclosed by dotted lines, to thereby generate an aggregation portion having a lower energy state. More specifically, unless high molecular chains aggregate, light of 430–470 nm, which is the emission wavelength of polyfluorene, is emitted. However, when high molecular chains are aligned to generate an aggregation with a lower energy state, short wave light with a higher energy state is not generated, and excitation energy is transferred to the aggregation portion with lower energy, from which light of longer wave with a lower energy state is generated. When the emissive layer 10 shown in FIG. 1 includes such an aggregation portion of high molecular chains, 510 nm light is emitted.

Introducing a skeleton which functions as steric hindrance into high molecular chains of polyfluorene can inhibit such thermal aggregation of high molecular chains of polyfluorene, making it possible to inhibit an aggregation. The present inventors have researched materials which cause such steric hindrance, and learned that use of acene having three or more benzene rings is preferable. According to an organic electroluminescence element of the present invention, a functional polymer obtained by copolymerization of fluorene and the above-mentioned acene and containing fluorene unit and acene unit having three or more benzene rings, is used as the emissive layer 10.

The molecular structure of this functional polymer is as follows:

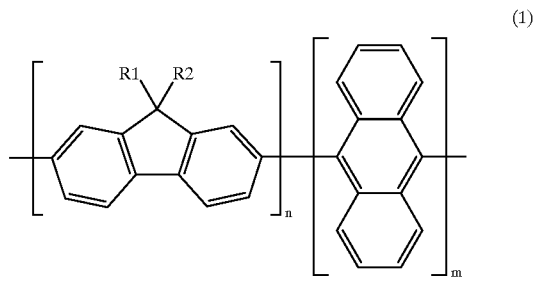

(1)

wherein R1 and R2 are selected from functional groups of alkyl (iso or normal), alkoxy, cycloalkyl, acyl, heteroaryl and aryl, alkenyl, stylyl, alkinyl, cyano, nitro, NHAr, NAr$_2$, and CF$_3$; and n and m are integers equal to or greater than 1.

In the above functional polymer, acene units are linked at different locations in polyfluorene chains. In this case, a ratio of the acene unit in the polymer skeleton is preferably 15% or less. More rate of the acene unit will lead to aggregation of acene per se.

The functional polymer obtained by copolymeration of fluorene and acene, provides steric hindrance by the acene unit, as described above, and therefore can prevent aggregation of high molecular chains of polyfluorene. In the high molecular chains, the acene unit rises at an angle of 70°–75° with respect to a plane formed by the fluorene unit, and it is believed that steric hindrance is generated by such a molecular structure.

The above-mentioned acene may have three or more benzene rings. In particular, besides anthracene denoted by molecular formula (1) having three benzene rings, naphthacene having four benzene rings and pentacene having five benzene rings is preferable. When anthracene is used for the acene unit, the emissive layer 10 of an organic electroluminescence element using such a functional polymer emits blue light having wavelength of 448 nm. When naphthacence is used for the acene unit, green light with a wavelength of 520 nm is emitted, while, when pentacence is used, red light having wavelength of 625 nm is emitted. Such light emission is achieved as follows. Holes and electrons injected from the cathode 14 and the anode 16, respectively, are recombined to excite the high molecular chains, so that the excitation energy transfers to the acene unit, which then emits light. Accordingly, when anthracene, naphthacene, and pentacene are simultaneously used for the acene unit, light of all three primary colors can be obtained.

As described above, when the above-mentioned functional polymer is employed for the emissive layer 10 of the electroluminescence element, aggregation of high molecular chains can be prevented while light of all three primary colors is also obtained.

Figure 3:
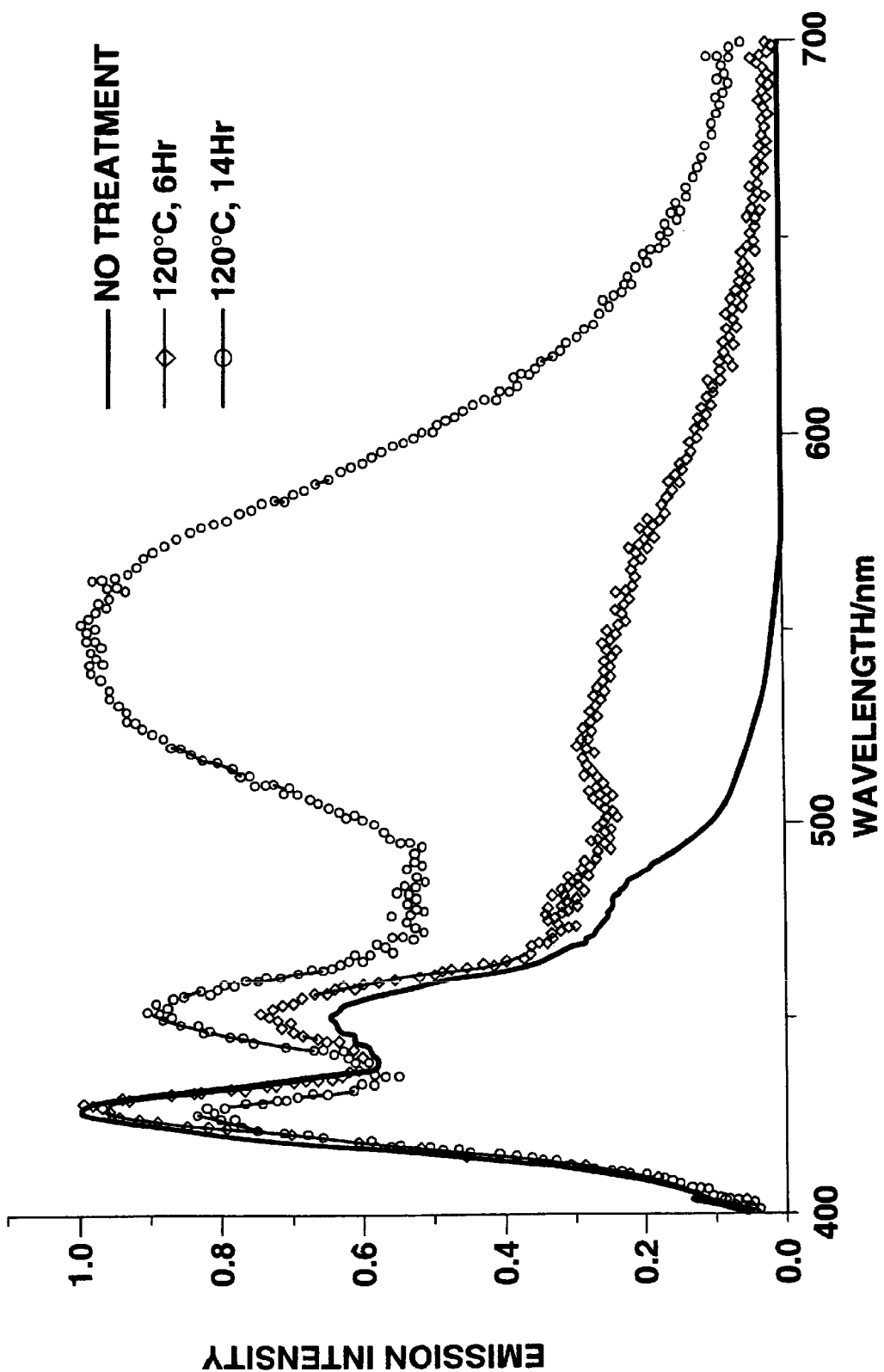
FIG. 3 is a graph depicting the peak wavelength of light emission of polyfluorene subjected to heat treatment.

FIG. 3 shows change in the wavelength of peak emission intensity of fluorescence from a polyfluorene (polydiocthylfluorene, in this example) subjected to a heat treatment and irradiated with ultraviolet light. The horizontal axis indicates wavelengths and the vertical axis indicates emission intensity of fluorescence when irradiated with ultraviolet light. The fluorescence spectrum for polyfluorene with no heat treatment is indicated by a solid line. The fluorescence spectrum for polyflurorene subjected to heat treatment at 120° C. for 6 hours is indicated by ◊, and the fluorescence spectrum for polyflurorene subjected to heat treatment at 120° C. for 14 hours is indicated by ○. As can be seen from FIG. 3, the peak wavelength of the emission intensity shifted to a longer wavelength as the length of heat treatment was increased. As previously described, heat treatment facilitates thermal motion of the high molecular chains of polyfluorene, to thereby increase the number of aggregation portions in which molecular chains are arranged in parallel, as shown in a region enclosed by the dotted line in FIG. 2.

Figure 4:
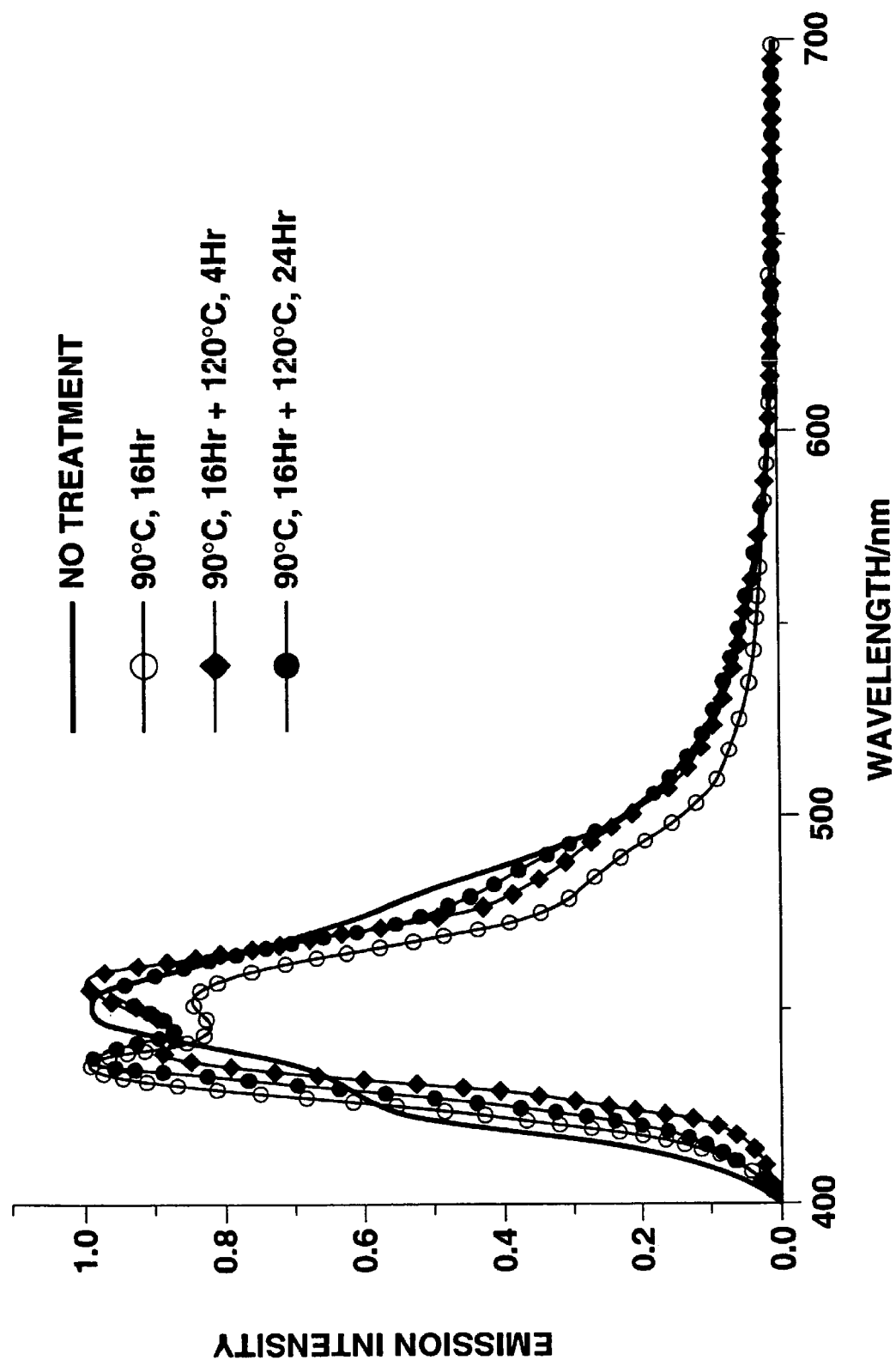
FIG. 4 is a graph depicting the peak wavelength of light emission of an example functional polymer of the present invention subjected to heat treatment.

FIG. 4, on the other hand, shows change in the wavelength of peak emission intensity of fluorescence from an emissive layer 10 comprising the functional polymer denoted by formula (1) which includes anthracene treated under various temperature conditions. As in FIG. 3, the horizontal axis indicates wavelength whereas the vertical axis indicates emission intensity. In the examples shown in FIG. 4, the emission intensities were measured for functional polymers subjected to no heat treatment, subjected to heat treatment at 90° C. for 16 hours, subjected to heat treatment at 90° C. for 16 hours followed by heat treatment at 120° C. for 4 hours, and subjected to heat treatment at 90°C. for 16 hours followed by heat treatment at 120° C. for 24 hours, respectively. As shown in FIG. 4, the polymers subjected to any one of the above-referenced heat treatments showed results which were substantially the same as those of the polymer that did not undergo heat treatment, because the functional polymer of the present invention can prevent aggregation of high molecular chains caused by thermal motion thereof due to steric hindrance obtained by the acene unit in the high molecular chains.

Although the acene unit contained in the functional polymer of formula (1) has three or more benzene rings, the acene unit is not limited to this example. Another example is shown in the following formula:

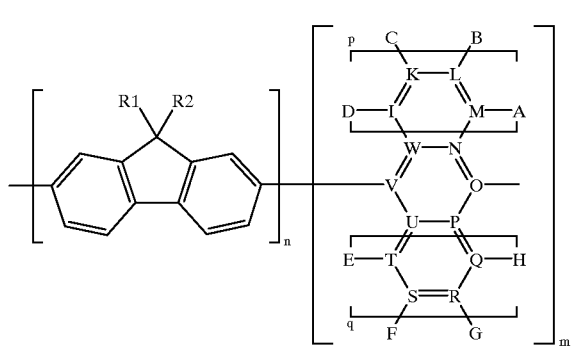

(2)

wherein, A through H are selected from alkyl, thioalkyl, alkoxy, aryl, aryloxy, thioaryl, heteroaryl, alkenyl, alkinyl, cyano, nitro, NHAr, NAr$_2$, condensed heterocyclic compound and a substituent including fluorine; I, and K through W are selected from C, O, N, P, S, and Si; R1 and R2 are selected from alkyl (iso or normal), cycloalkyl, acyl, heteroaryl and aryl, alkenyl, stylyl, alkinyl, cyano, nitro, NHAr, NAr$_2$, and CF$_3$; p and q are integer numbers which satisfy p+q$\geq$2; and n and m are integers equal to or greater than 1.

As described above, the acene introduced into the polyfluorene skeleton is not limited to simple acene, and acene containing various functional groups or heterocyclic compounds in which one or more carbon atoms of acene are replaced with other elements can also be used.

R1 and R2 bonded to the fluorene unit in the above formula may be a variety of functional groups such as alkyl group, as already described. In order to prevent thermal aggregation of high molecular chains, the largest possible functional groups are preferable for R1 and R2 because the larger the functional group, the larger can be the steric hindrance for inhibiting thermal aggregation.

The functional polymer according to the present invention denoted by formula (2) can be used as the emissive layer 10 of the above-described organic electroluminescnece element. In addition to this function, the functional polymer has a property of changing emission wavelength when excited by ultraviolet irradiation having a wavelength of 380 nm or less. The emission wavelength is 450 nm when anthracene is used for the acene unit, 520 nm when naphthacene is used, and 625 nm when pentacene is used, for example. When the functional polymer using any of the foregoing acene units is irradiated with ultraviolet ray of 365 nm, for example, blue light emission having emission wavelength of 435 nm is emitted. Thus, when the functional polymer whose emission wavelength has been changed due to ultraviolet irradiation is heated, the wavelength thereof is returned to its original level.

Application of the forgoing characteristics that the emissive wavelength can be reversibly changed by ultraviolet irradiation and heating treatment enables production of an emissive element for storing digital information. As a result, the emissive element can be used as an optical memory in which information may be stored by optically exciting the above-mentioned functional polymer using ultraviolet irradiation and in which the stored information may be deleted by heating the element.

It can also be seen that, because of the conjugated structure as indicated by formula (2), the electron and hole transportation ability of the above-described functional polymer is superior. Accordingly, the functional polymer of the present invention can be used as a hole transport element, such as, for example, a photosensitive member in a camera.

Synthesis methods for the functional polymer of the present invention will next be described with reference to specific examples. In the following synthesis method in which acene is introduced into the molecular skeleton of polyfluorene, the acene unit to be used may be, besides simple acene, acence containing various functional groups or heterocyclic compounds in which one or more carbon atoms of benzene rings in the acene skeleton are replaced with other elements.

EXAMPLES

Example 1

Starting materials for forming the polyfluorene skeleton, specifically a compound A (2,7-dibromo-9,9'-dialkylfluorene) and a compound B (2,7-bis-(1,3,2-dioxaborolan-2-yl)-9,9'-dialkyl-fluorene)may be synthesized according to the following process denoted by formula (3). Alkyl group bonded to the fluorene skeleton may be octyl group and hexyl group, as well as functional groups identical with R1 and R2 of formula (2).

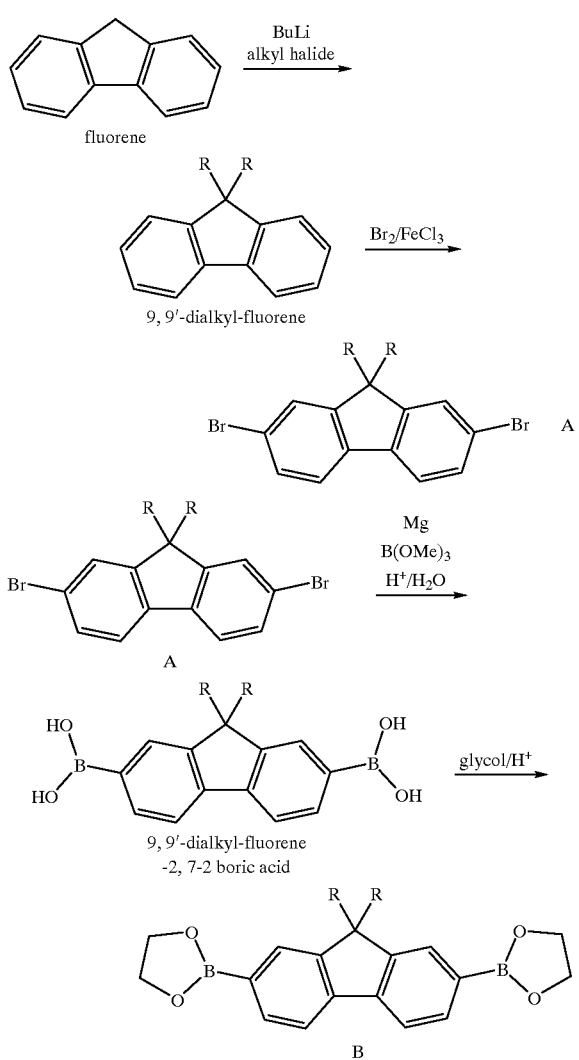

An example of synthesis of the above compound A will be described.

62.5 ml (125.0 mmol) of n-BuLi at a temperature of −78°C. was slowly added using a syringe to a solution in which 20 g (120.5 ml) of fluorene was dissolved into 60 ml of dehydrated THF. The solution immediately turned yellow. The temperature of the solution was maintained for one hour, after which 20 g (11.3 ml, 125.0 mmol) of n-hexyl bromide was added. Thereafter, the solution was allowed to stand at room temperature, and was then stirred until its reddish color disappeared.

The solution was then again cooled to −78° C. After addition of 70 ml(140.0 mmol) of n-BuLi, the solution was stirred for 60 minutes while its temperature was maintained, which resulted in a solution with a dark red color. Then, 23 ml (166 mmol) of n-hexyl bromide was added and the reaction mixture and was stirred at room temperature overnight. The resulting reddish solution was poured into 1.5 l of water, and a water portion was extracted in three steps with 100 ml of methylene chloride after an organic layer was separated. The separated organic layer and organic substances extracted from the water portion were mixed and washed with 150 ml of NaCl solution and 150 ml of water. After the organic substances were dried over $MgSO_4$, the solvent was caused to evaporate therefrom using a rotary evaporator to obtain 40 g of thin yellowish oil, which was then subjected to distillation at 150° C. under a vacuum of $5 \times 10^{-3}$ mm Hg, and 38 g of 9,9'-di-(n-hexyl)-fluorene was obtained as a colorless oil, which corresponds to 9,9'-dialkylfluorene in the above process.

Next, 25 g (74.8 mmol)of this 9,9'-di-(n-hexyl)-fluorene and 120 mg (125.0 mmol) of ferric chloride was suspended in 300 ml of chloroform and was then cooled to 0° C. 24.15 g (7.8 ml, 75 mmol) of bromine was slowly added to the mixture while exposing the mixture to light. The resultant slurry was left to stand at a room temperature and was then stirred overnight.

The reaction mixture was poured into 500 ml water and an organic layer and a water portion were separated. The obtained organic layer was washed several times using aqueous $Na_2SO_3$ and then using a NaCl solution and water, and was dried using $Na_2SO_4$, and the solvent was evaporated under reduced pressure. The viscous thin yellowish oil thus obtained was gradually crystallized after being cooled to room temperature. The crystal was caused to recrystallize using a solution composed of chloroform and methanol, to obtain 36.4 g of 2,7-dibromo-9,9'-di-(n-hexyl)-fluorene (compound A) which is colorless and waxy.

Next, an example of synthesis of compound B will be described.

First, 5 g (10.2 mmol) of 2,7-dibromo-9,9'-di-(n-hexyl) fluorene (compound A) was caused to react with 486 mg (20.4 mmol) of Mg in 50 ml of dehydrated THF to prepare a bis-Grignard compound. After four hours of reflux for Mg to which the compound A was added, substantially all the magnesium was eliminated. The solution thus obtained was cooled to room temperature and was added, using a syringe, to a 30 ml of THF solution in which 5 ml (32 mmol) of trimethyl borate was dissolved and which was cooled with aceton-dry ice. The reaction mixture was then heated to room temperature and was stirred for one night. After 24 hours, a gel precipitate was obtained. Thereafter, 40 ml THF was added to the gel precipitate, and was then added to a solution obtained by adding 3 ml of thick sulfuric acid to 100 ml of water and stirred for 30 minutes. The mixture thus obtained was poured into 300 ml of water, extracted using ethyl acetate, and then dried to evaporate the solvent. A substantially colorless precipitate was remained.

The precipitate was added to a mixture composed of 50 ml of aqueous 2N KOH and 20 ml of dioxane, heated and subjected to reflux. After an hour, the obtained solution was cooled to room temperature and 100 ml of hexan was added. Subsequent to separation of an organic layer, a water portion was extracted once again with 20 ml of hexan. 5N HCl was added to the organic layer to cause an acid component to precipitate. The precipitate was added to 40 ml of ethyl acetate and stirred for five minutes for layer separation. The separated layer was dried using $Na_2SO_4$, and then hexan was added until precipitation started. After precipitation at a room temperature, the layer was cooled for 12 hours at $-20°$ C.

In this manner, 9,9'-dihexyl-fluorene-2,7-2 boric acid was obtained. The acid was then dissolved in 200 ml of $CH_2Cl_2$. 1 ml of thick sulfuric acid and equal mol of ethylene glycol was further added, and the solution was subjected to reflux for three hours. The solution thus obtained was put in a separating funnel, and an extremely viscous water portion containing sulfuric acid and alcohol was removed while an organic layer was washed once with 20 ml of aqueous $NaHCO_3$. After drying using $Na_2SO_4$, the solvent was removed under reduced pressure. A colorless crystal was then obtained after cooling. The crystal was caused to recrystallize using hexan, to obtain colorless 2,7-bis-1,3,2-dioxaborolan-2-yl)-9,9'-dihexyl-fluorene (compound B).

An example of synthesis of the functional polymer of the present invention comprising fluorene unit and anthracene unit using the compounds A and B obtained above will be described.

First, a synthesis method called Yamamoto method will be described for synthesis of the functional polymer according to the present invention.

Yamamoto method (4)

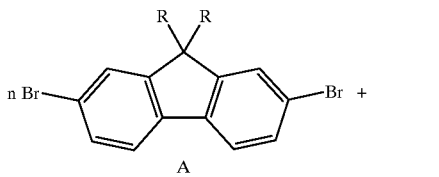

As shown in the above reaction formula (4), when the compound A and 9,10-dibromoanthracene was mixed and polymerized in the presence of nickel catalyst of $Ni(COD)_2$ (COD:cyclooctadiene), a functional polymer composed of 9,9'-dialkylfluorene unit and anthracene unit is synthesized. In this case, a ratio of the anthracene unit to be added is set to be 15% or less.

9,10-dibromoanthracene used in the above reaction is commercially available. Further, a variety of anthracene derivatives having, in place of boron, leaving groups similar to halogen, such as mesylate, triflate, tosylate, and nonaflate as a substituent can be used.

It is also possible to copolymerize the functional polymer according to the present invention by means of the Suzuki method which will be described below, using the compound B.

Suzuki method (5)

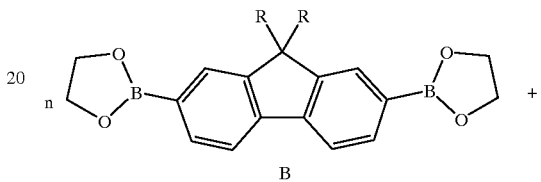

As shown in formula (5), the compound B and the above-described 9,10-dibromoanthracene is mixed to cause copolymerization using palladium catalyst of Pd $(PPh_3)_4$ ($PPh_3$: triphenylphosphine). A functional polymer composed of 9,9'-dialkylfluorene unit and anthracene unit can also be synthesized according to this process.

While a dihalogen derivative which is commercially available can be used for the case of antracene, no articles are on the market for cases of higher acene such as naphthacene and pentacene. Therefore, monomers for copolymerizing the functional polymer according to the present invention may be synthesized according to the following process (6). Although the following synthesis method will be described using anthraquinone, monomers containing higher acene unit can be synthesized when quinone derivatives of higher acene such as naphthacene and pentacene are used.

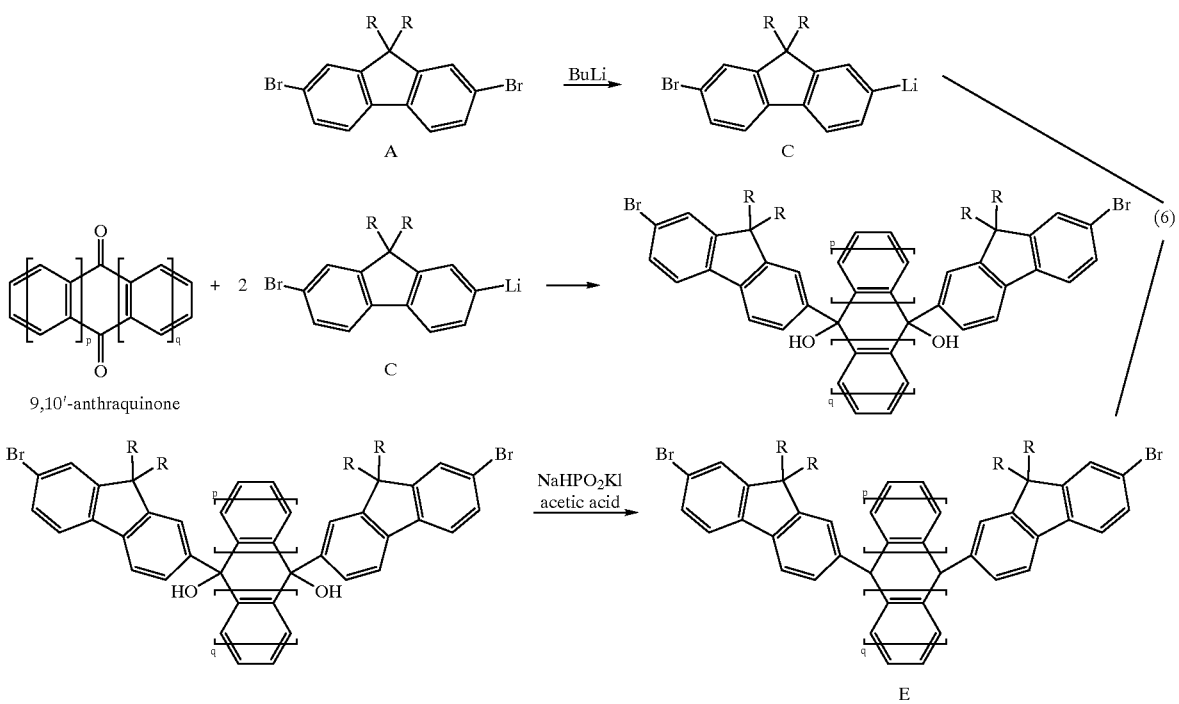

5.7 ml (9.12 mmol) of n-BuLi at −60° C. was added, using a syringe, to a solution obtained by dissolving 5 g (9.12 mmol) of compound A in 250 ml THF. After 30 minutes, a reddish reaction mixture containing the above-described compound C was obtained. A solution obtained by dissolving 0.95 g (4.56 mmol) of 9,10-anthraquinone in 250 ml THF was slowly added to the reaction mixture. When addition was completed, the solution was maintained at room temperature and stirred for one night. After 20 hours of stirring, the reaction was stopped by 20 ml of glacial acetic acid, and THF was evaporated under reduced pressure. From the above process, a compound D (dihydroxyacene derivative) was obtained.

The intermediate product D thus obtained is subjected to reducing dehydroxylation reaction to provide a monomer capable of polymerization. A reducing dehydroxylation agent may be, for example, a combination of NaHPO$_2$, KI and acetic acid, a combination of SnCl$_2$ and acetic acid, and Zn in HCl or SmI$_2$ system.

In this example, 50 ml of acetic acid, together with 2 g of NaHPO$_2$ and 1 g of KI, was added to the intermediate product D, and the mixture was subjected to reflux for two hours. The reaction mixture was then cooled and poured into water, extracted using methylene chloride, and dried on Na$_2$SO$_4$ for concentration. A yellowish crystal substance thus obtained was dissolved in chloroform and was filtered through a short column of silica gel. Then, the solvent was evaporated to thereby obtain 2.4 g of coarse product. The product was subjected to repetitive recrystallization using methyl chloride-methanol, to obtain 1.3 g of 9,10-bis-9',9'-dioctyl-7-bromo-fluorene-2yl)-anthracene (monomer E).

Alternatively, when quinone of higher acene such as naphthacene and pentacene is used in place of 9,10-anthraquinone, as already described, monomer E in which higher acence is bonded as the acene unit can be obtained. Accordingly, in the acene unit of monomer E denoted in formula (6), p and q are integer numbers which satisfy p+q≧2.

When thus obtained monomer E having bromine bonded to both ends is synthesized with fluorene using the above-mentioned Yamamoto method for copolymerization, the functional polymer according to the present invention can be obtained.

In this example, monomer E was synthesized with 2,7-dibromo-9,9'-di-(n-hexyl)-fluorene. When higher acene such as naphthacene and pentacene is introduced into monomer E as acene unit, a functional polymer containing higher acene unit can be obtained.

Although only n-hexyl was described as alkyl group R bonded to the fluorene unit, a variety of substituents may be employed, as already described with respect to formula (2).

Further, when quinone indicated in the following formula (7) is used for synthesis of monomer E, acene introduced in the polyfluorene skeleton is not simple acene, but may be acene containing a variety of functional groups or heterocyclic compounds in which one or more carbon atoms are replaced with other elements.

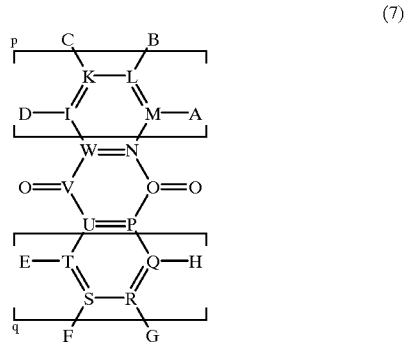

(7)

wherein, A through H are selected from alkyl, thioalkyl, alkoxy, aryl, aryloxy, thioaryl, heteroaryl, alkenyl, alkinyl, cyano, nitro, NHAr, NAr$_2$, condensed heterocyclic compound and a substituent including fluorine; I, and K through W are selected from C, O, N, P, S, and Si, and p and q are integer numbers which satisfy p+q≧2.

Example 2

Next, an example of an organic electroluminescnece element according to the present invention will be described.

Figure 5:
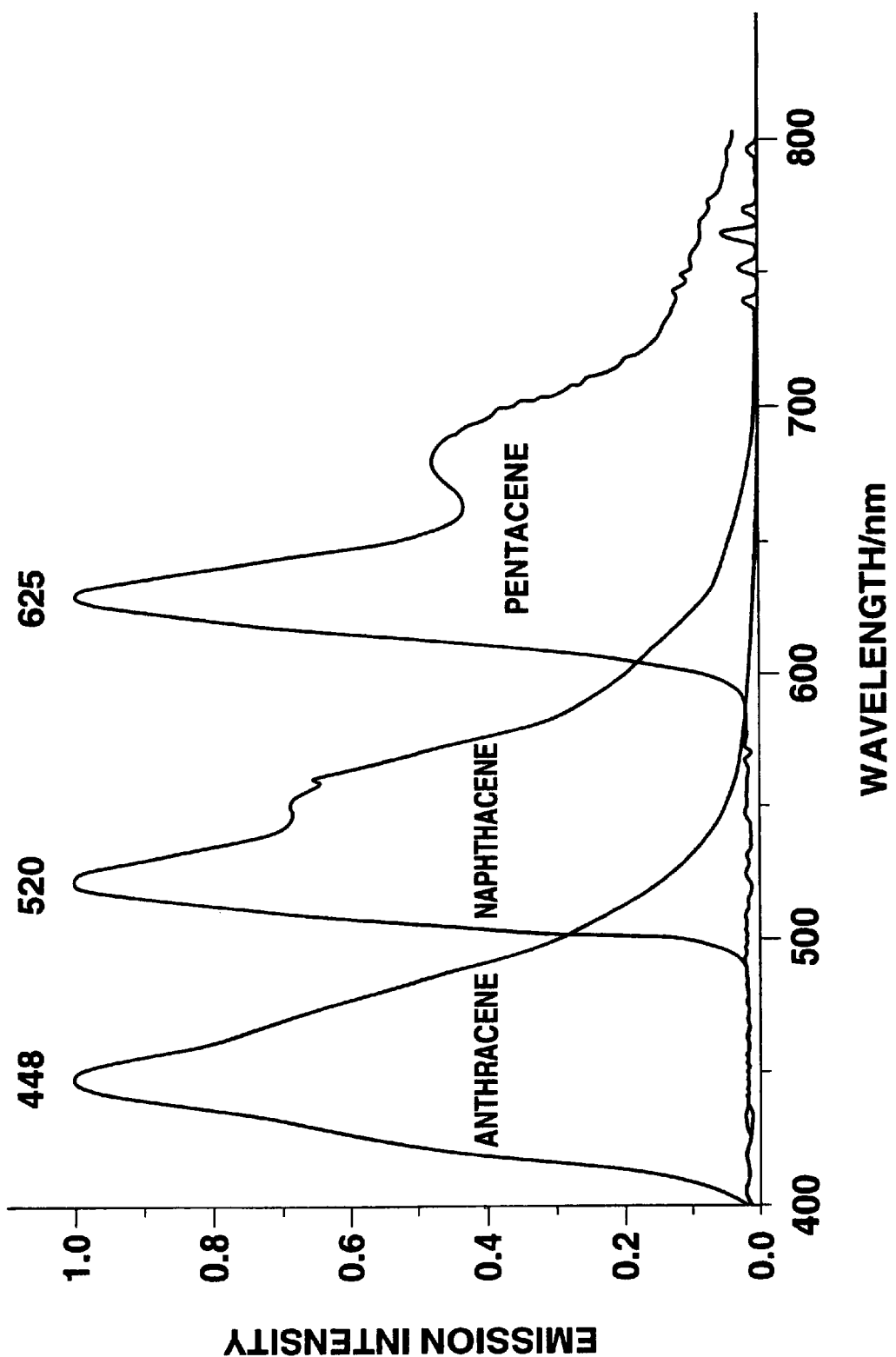
FIG. 5 is a graph depicting the peak wavelength of light emission of an organic electroluminescence element according to the present invention.

Three types of electroluminescence elements, each having an emissive layer composed of the above-mentioned functional polymer containing 10% of acene unit, which is any one of anthracene, naphthacene, or pentacene, were manufactured. Each element had the structure shown in FIG. 1, in which PEDT was used for a conductive polymer layer. A substrate having a patterned ITO layer was washed with an organic solvent and was then subjected to UV ozonization. On the substrate were formed a PEDT film of 1000 Å using spin coating technique and a film of 1000 Å composed of above-mentioned copolymer. The layered film was then placed within a vacuum evaporator for forming, as electrodes, an LiF film of 5 Å and Ca film of 1600 Å. The characteristics of the tentative element were evaluated in a nitrogen atmosphere. When a positive d.c. voltage was applied to the ITO side and a negative d.c. voltage was applied to the Ca electrode side, the element generated light emission, whose emission spectrum is shown in FIG. 5. The elements employing polymers containing anthracene, naphthacene, and pentacene, respectively, generated EL emission having respective pure colors of blue, green, and red. These spectra coincided with the fluorescence spectra of corresponding polymers to a very high degree. Light emission was stable even when the elements were driven continuously.

Example 3

An example of an optical memory according to the present invention will be described.

Figure 6:
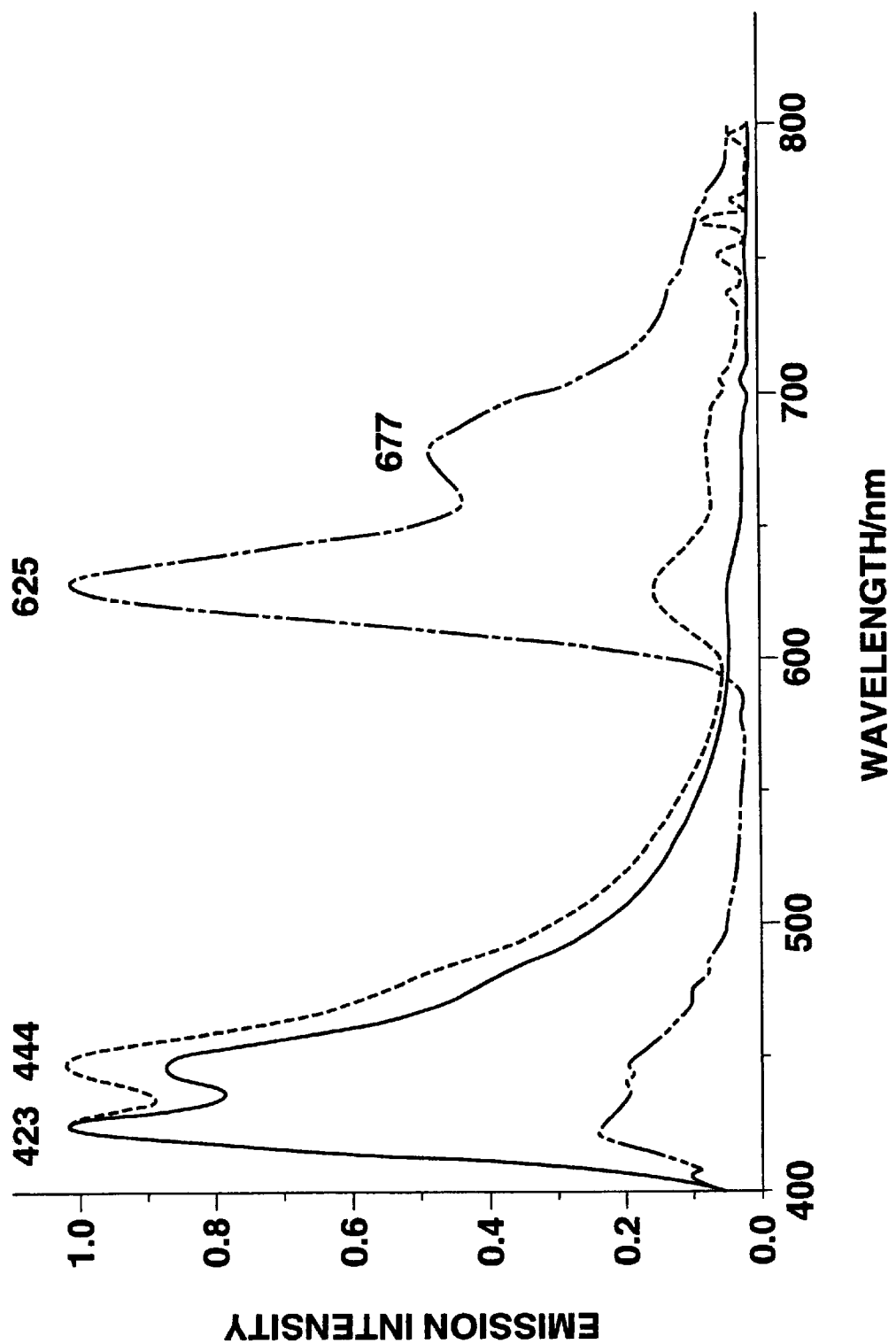
FIG. 6 is a graph depicting the peak wavelength of fluorescence of a functional polymer containing pentacene according to the present invention.

A film having a thickness of 1000 Å and composed of a polymer containing pentacene was formed on a glass substrate, sufficiently dried, and then irradiated with ultraviolet light with a wavelength of 365 nm. A change in fluorescence spectrum caused by this process is shown in FIG. 6. Initially the element generated red emission with peak wavelength of 625 nm, and then fluorescence peak at longer wavelength was eliminated with ultraviolet irradiation, thereby changing the emission to blue light with peak wavelengths of 423 nm and 444 nm. This emission was stable and could exist for a long time. When the element was heated to 50° C. or higher, red emission with wavelength peak at a longer wavelength was once again generated. This change could be reversibly repeated.

As described above, according to the present invention, it is possible to obtain a functional polymer having emission function which is highly efficient and highly stable, reversible optical property, and high carrier transport ability.

Further, the functional polymer can be utilized to implement a planar light source which is highly effective and of low cost with large area as well as a full-color flat display.

The functional polymer can be also utilized to implement an electrophotographic photoreceptor of high performance and a high-density optical memory.

While the preferred embodiment of the present invention has been described using specific terms, such description is for illustrative purposes only, and it is to be understood that changes and variations may be made without departing from the spirit or scope of the appended claims.

What is claimed is:

1. A functional polymer comprising a polymer prepared by copolymerizing a fluorene monomer having a fluorene skeleton and an acene monomer having three or more benzene rings, thereby providing a functional polymer comprising fluorene units and acene units.

2. The functional polymer according to claim 1, wherein said acene unit is at least one of anthracene, naphthacene, and pentacene.

3. The functional polymer according to claim 1, which consists of a copolymer having fluorine units and anthracene units.

4. The functional polymer according to claim 1, wherein said acene unit is the right part of the following structure:

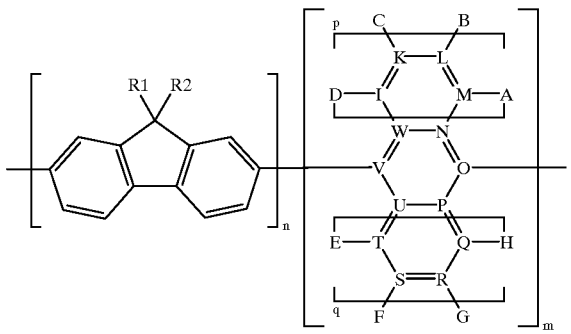

wherein

A through H are selected from alkyl, thioalkyl, alkoxy, aryl, aryloxy, thioaryl, heteroaryl, alkenyl, alkinyl, cyano, nitro, NHAr, NAr$_2$, condensed heterocyclic compound and a substituent including fluorine;

I, and K through W are selected from C, O, N, P, S, and Si;

R1 and R2 are selected from alkyl (iso or normal), cycloalkyl, acyl, heteroaryl and aryl, alkenyl, styryl, alkinyl, cyano, nitro, NHAr, NAr$_2$, and CF$_3$;

p and q are integer numbers which satisfy p+q≧2; and n and m are integers equal to or greater than 1.

5. The functional polymer according to claim 4, wherein said m and n satisfy m<n.

6. The functional polymer according to claim 1, wherein the functional polymer comprises 15% or less of the acene unit.

7. The functional polymer according to claim 2, wherein the functional polymer comprises 15% or less of the acene unit.

8. The functional polymer according to claim 3, wherein the functional polymer comprises 15% or less of the acene unit.

9. The functional polymer according to claim 4, wherein the functional polymer comprises 15% or less of the acene unit.

10. The functional polymer according to claim 4 prepared by copolymerizing a monomer of the following formula and a fluorene monomer:

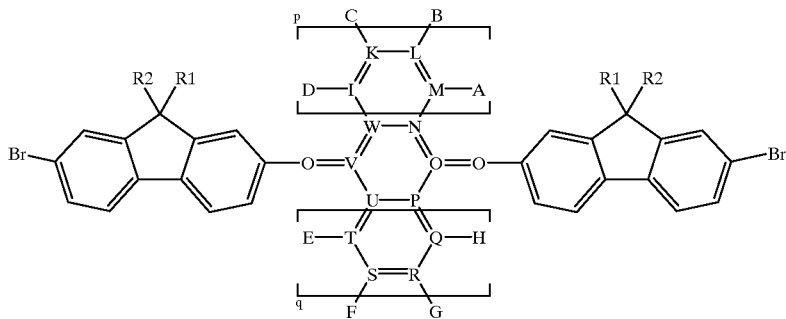

wherein
- A through H are selected from alkyl, thioalkyl, alkoxy, aryl, aryloxy, thiaryl, heteroaryl, alkenyl, alkinyl, cyano, nitro, NHAr, $NAr_2$, condensed heterocyclic compound and a substituent including fluorine;
- I, and K through W are selected from C, O, N, P, S, and Si;
- R1 and R2 are selected from alkyl (iso or normal), cycloalkyl, acyl, heteroaryl and aryl, alkenyl, styryl, alkinyl, cyano, nitro, NHAr, $NAr_2$, and $CF_3$;
- p and q are integer numbers which satisfy $p+q \geq 2$.

11. An organic electroluminescence element comprising a functional polymer according to claim 1.

12. An optical memory comprising a functional polymer according to claim 1.

13. A hole transport element comprising a functional polymer according to claim 1.

* * * * *